(12) United States Patent
Goosen et al.

(10) Patent No.: US 11,961,700 B2
(45) Date of Patent: Apr. 16, 2024

(54) SYSTEMS AND METHODS FOR IMAGE ENHANCEMENT FOR A MULTI-BEAM CHARGED-PARTICLE INSPECTION SYSTEM

(71) Applicant: ASML Netherlands B.V., Veldhoven (NL)

(72) Inventors: Maikel Robert Goosen, Eindhoven (NL); Albertus Victor Gerardus Mangnus, Eindhoven (NL); Lucas Kuindersma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 375 days.

(21) Appl. No.: 17/601,697

(22) PCT Filed: Mar. 25, 2020

(86) PCT No.: PCT/EP2020/058354
§ 371 (c)(1),
(2) Date: Oct. 5, 2021

(87) PCT Pub. No.: WO2020/200958
PCT Pub. Date: Oct. 8, 2020

(65) Prior Publication Data
US 2022/0199358 A1   Jun. 23, 2022

(30) Foreign Application Priority Data

Apr. 5, 2019 (EP) .................................. 19167583

(51) Int. Cl.
*H01J 37/22* (2006.01)
*G06T 7/00* (2017.01)
*H01J 37/28* (2006.01)

(52) U.S. Cl.
CPC ............ *H01J 37/222* (2013.01); *G06T 7/001* (2013.01); *H01J 37/28* (2013.01);
(Continued)

(58) Field of Classification Search
CPC .... H01J 37/222; H01J 37/28; H01J 2237/223; H01J 2237/2817; G06T 7/001;
(Continued)

(56) References Cited

U.S. PATENT DOCUMENTS

| | | | |
|---|---|---|---|
| 2015/0002652 | A1 | 1/2015 | Takasugi et al. |
| 2017/0084423 | A1 | 3/2017 | Masnaghetti et al. |
| 2019/0066973 | A1 | 2/2019 | Kawada et al. |

FOREIGN PATENT DOCUMENTS

| | | |
|---|---|---|
| EP | 2866245 B1 | 4/2015 |
| KR | 20090111207 A | 10/2009 |

(Continued)

OTHER PUBLICATIONS

International Search Report and Written Opinion issued by the International Searching Authority in related PCT Application No. PCT/EP2020/058354, dated Jun. 3, 2020 (10 pgs.).

(Continued)

*Primary Examiner* — Nicole M Ippolito
*Assistant Examiner* — Hanway Chang
(74) *Attorney, Agent, or Firm* — Finnegan, Henderson, Farabow, Garrett & Dunner, LLP

(57) ABSTRACT

Embodiments consistent with the disclosure herein include methods for image enhancement for a multi-beam charged-particle inspection system. Systems and methods consistent with the present disclosure include analyzing signal information representative of first and second images, wherein the first image is associated with a first beam of a set of beams and the second image is associated with a second beam of the set of beams; detecting, based on the analysis, (Continued)

disturbances in positioning of the first and second beams in relation to a sample; obtaining an image of the sample using the signal information of the first and second beams; and correcting the image of the sample using the identified disturbances.

15 Claims, 5 Drawing Sheets

(52) U.S. Cl.
CPC ............... *G06T 2207/10061* (2013.01); *G06T 2207/20048* (2013.01); *G06T 2207/30141* (2013.01); *H01J 2237/223* (2013.01); *H01J 2237/2817* (2013.01)

(58) Field of Classification Search
CPC . G06T 2207/10061; G06T 2207/20048; G06T 2207/30141
See application file for complete search history.

(56) References Cited

FOREIGN PATENT DOCUMENTS

| | | |
|---|---|---|
| TW | 201721226 A | 6/2017 |
| TW | 201734441 A | 10/2017 |
| TW | 201911360 A | 3/2019 |
| WO | WO 03/044821 A1 | 5/2003 |
| WO | WO 2019/021536 A1 | 1/2019 |
| WO | WO 2018/100669 A1 | 7/2019 |

OTHER PUBLICATIONS

Office Action issued by the Taiwanese Patent Office in related Application No. TW 109111396, dated Feb. 5, 2021 (12 pgs.).
Pluska M. et al., Elimination of scanning electron microscopy image periodic distortions with digital signal-processing methods, Journal of Microscopy, vol. 224, Pt. 1 Oct. 2006, pp. 89-92, (4 pgs.).

300
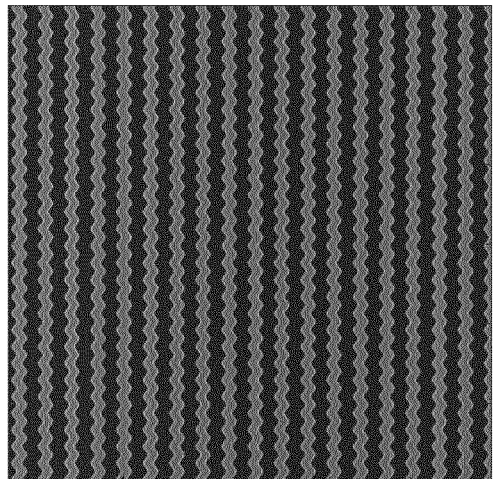
310  FIG. 3A
301
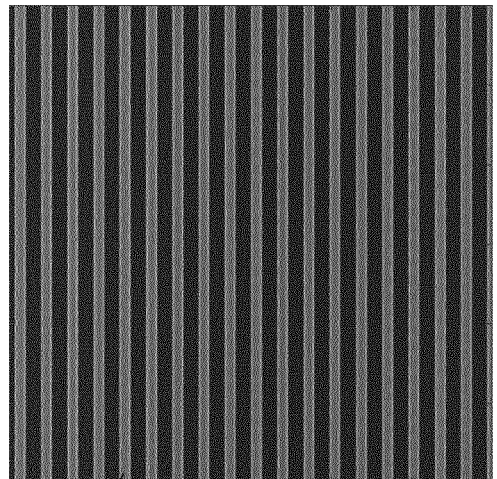
311  FIG. 3B
400
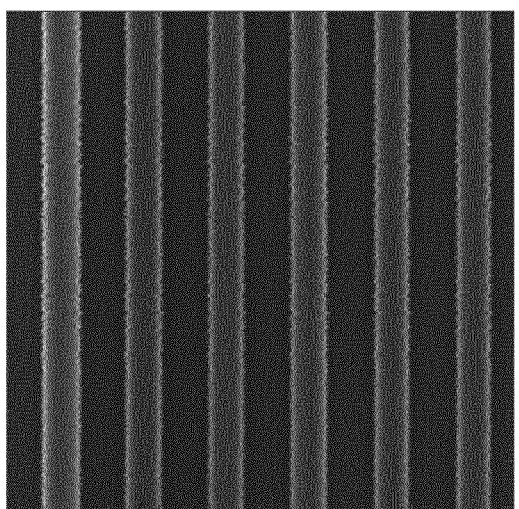
410  FIG. 4A
401
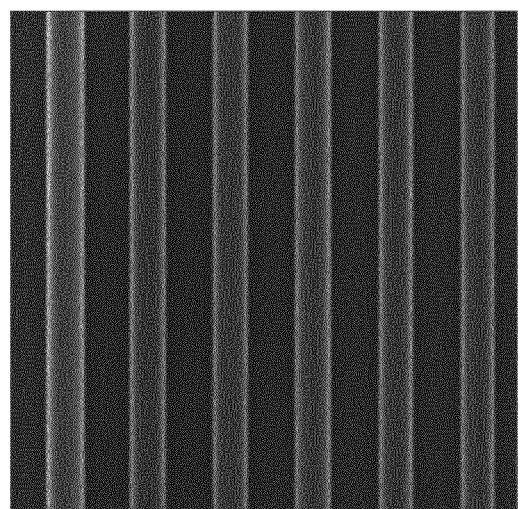
411  FIG. 4B

500

501

510  
511

SYSTEMS AND METHODS FOR IMAGE ENHANCEMENT FOR A MULTI-BEAM CHARGED-PARTICLE INSPECTION SYSTEM

CROSS-REFERENCE TO RELATED APPLICATIONS

This application claims priority to International Application No. PCT/EP2020/058354, filed on Mar. 25, 2020, and published as WO 2020/200958 A1, which claims priority of EP Application No. 19167583.4 which was filed on Apr. 5, 2019. The contents of these applications are incorporated herein by reference in their entireties.

TECHNICAL FIELD

The embodiments provided herein disclose a charged-particle beam inspection system, and more particularly systems and methods of enhancing images captured by multi-beam scanning electron microscopes.

BACKGROUND

In manufacturing processes of integrated circuits (ICs), unfinished or finished circuit components are inspected to ensure that they are manufactured according to design and are free of defects. Inspection systems utilizing optical microscopes or charged-particle (e.g., electron) beam microscopes, such as a scanning electron microscope (SEM) can be employed. IC components are manufactured by placing multiple layers onto one another to build the IC. Throughout the manufacturing process, SEMs can scan the IC and provide imagery that can be used to ensure the manufactured IC is meeting specifications.

In high speed manufacturing systems, the stage must be positioned quickly and with precision to ensure an accurate image scan. But dynamic disturbances such as internal pump vibrations, floor vibrations, stage deformations, or measurement error, can introduce distortion into the image. Some systems use hardware mechanisms to damp vibrations or insulate the sample from dynamic disturbances, but these systems increase complexity and costs, and can often introduce new errors in the captured images.

Accordingly, methods and systems for correcting scanned images without the need for additional hardware are desired.

SUMMARY

Embodiments consistent with the disclosure herein include methods for image enhancement for a multi-beam charged-particle inspection system. Systems and methods consistent with the present disclosure include analyzing signal information representative of first and second images, wherein the first image is associated with a first beam of a set of beams and the second image is associated with a second beam of the set of beams; identifying, based on the analysis, disturbances in positioning of the first and second beams in relation to a sample; obtaining an image of the sample using the signal information of the first and second beams; and correcting the image of the sample using the identified disturbances.

In some embodiments, analyzing the signal information further comprises using coherent filtering to analyze the signal information.

In some embodiments using coherent filtering further comprises applying a linear operator to the signal information; generating a filter based on the properties of the first and second images; and filtering the signal information by applying the filter to the signal information.

In some embodiments the filter is based on averaging power spectral densities of the first and second images.

In some embodiments the filter is based on determining a peak in the cross-spectral density for a combination of the first and second images.

In some embodiments the peak includes a plurality of peaks in the cross-spectral density for a combination of the first and second images.

In some embodiments the linear operator includes a Hilbert transform.

In some embodiments the linear operator includes a Fourier transform.

In some embodiments generating the filter further comprises analyzing signal information representing an entirety of each of the first and second images.

In some embodiments generating the filter further comprises analyzing signal information representing a scan line of the first and second images.

In some embodiments the system and methods further include filtering white noise in the signal information with a white noise filter.

In some embodiments the white noise filter is based on a power spectral density of at least one of the first and second images.

In some embodiments the charged-particle inspection system is one of a scanning electron microscope, transmission electron microscope, or a scanning ion microscope.

BRIEF DESCRIPTION OF FIGURES

FIGS. 3A-3B are exemplary diagrams of images of a sample scanned by an electron beam inspection system of FIG. 1, consistent with embodiments of the present disclosure.

FIGS. 4A-4B are exemplary diagrams of images of a sample scanned by an electron beam inspection system of FIG. 1, consistent with embodiments of the present disclosure.

DETAILED DESCRIPTION

Figure 1:
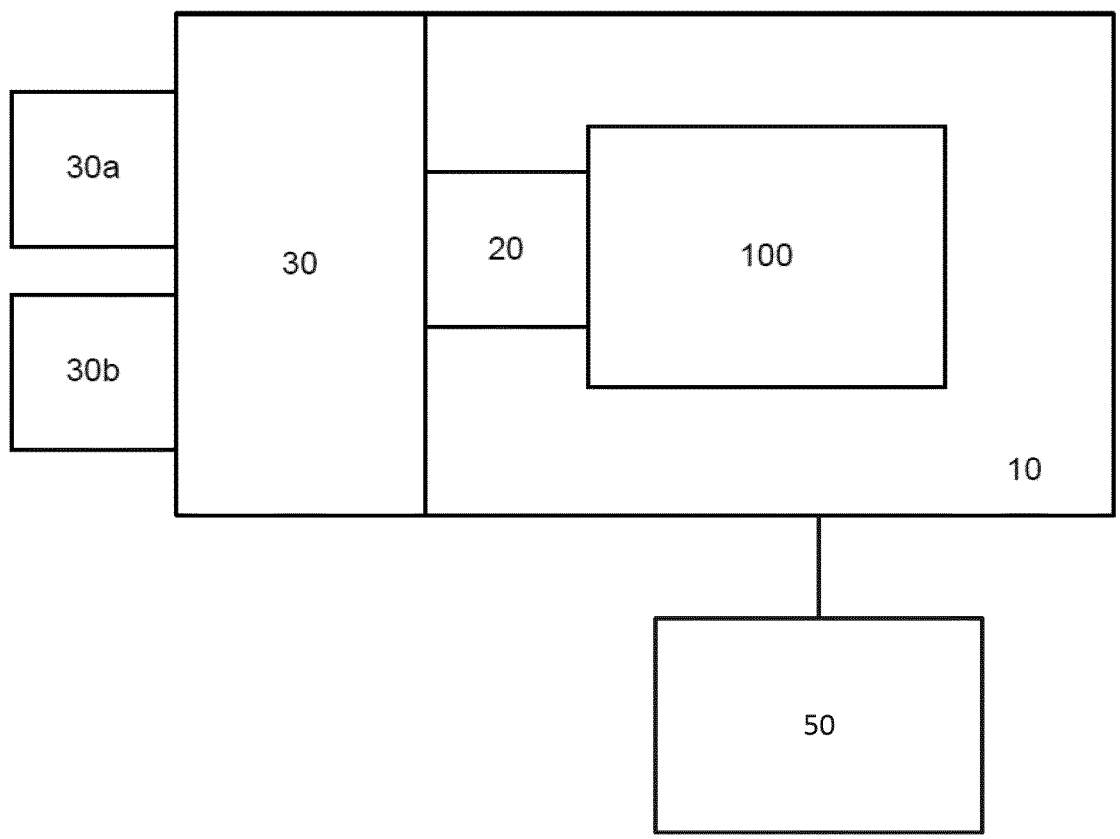
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing electron beams, the disclosure is not so limited. Other types of charged-particle beams may be similarly applied. Furthermore, other imaging systems may be used, such as optical imaging, photo detection, x-ray detection, etc. It is appreciated by one of ordinary skill in the art that in a multi-beam charged-particle system the sub-beams generated from the main beam emitted by the source are referred to as beamlets. It is also appreciated that one of ordinary skill in the art would understand that the same methods and disclosure would apply to multi-column charged-particle beam inspection systems. In multi-column charged-particle beam systems, the system generates multiple beams which function in a manner consistent with beamlets in a multi-beam system.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

While high process yield is desirable in an IC chip manufacturing facility, it is also essential to maintain a high wafer throughput, defined as the number of wafers processed per hour. High process yields, and high wafer throughput can be impacted by the presence of defects, especially when operator intervention is involved. Thus, detection and identification of micro and nano-sized defects by inspection tools (such as, a SEM) may be essential for maintaining high yields and low cost. Systems used to maintain high wafer throughput can introduce vibrations or other dynamic disturbances into the images captured by inspection systems, distorting the images and reducing the effectiveness of the inspection.

In a charged-particle beam imaging or inspection system, such as, for example, a SEM, the charged-particle beam may be focused on the wafer to produce an image of components and structures on an integrated circuit. The SEM focuses a charged-particle beam, multiple charged-particle beams, or multiple beamlets onto an integrated circuit. The SEM detects secondary electrons emitted as a result of the beams or beamlets interaction with the integrated circuit and uses the secondary electrons to generate an image signal that can be interpreted as an image of the integrated circuit. In this way, the SEM generates image signals resulting from the beams or beamlets.

But dynamic disturbances, like vibrations from the internal components of the SEM or from the environment, can disrupt the positioning of the charged-particle beam in relation to a wafer under inspection. This disruption affects the resulting images produced during inspection as shown in the exemplary images of FIGS. 3A, 4A, and 5A. The disturbances should be accounted for to obtain accurate images of the wafer and the integrated circuit like those shown in FIGS. 3B, 4B and 5B.

Some methods and systems attempt to prevent the vibration and environment effects that cause the dynamic disturbances and distort the resulting imagery. But these often suffer from their own deficiencies. For example, some SEM systems may use air-mounts, counterweights, or other mechanical systems to reduce the vibrations or environment effects. These, however, introduce additional hardware complexity, which can be prone to errors or introduce their own additional disturbances.

In an example, instead of using additional hardware to prevent the causes of dynamic disturbances, a SEM corrects images after or while they are captured. Other examples use other methods of correcting for dynamic disturbances. In this example, the multi-beam SEM uses information gathered from the image signal generated as a result of multiple beamlets to isolate the result of the disturbances in the captured image scan. For example, because each beamlet in the multi-beam SEM is affected by the dynamic disturbances in the same way, the multi-beam SEM can analyze the image signals that result from each of the beamlets to identify the image artifacts introduced by those common disturbances and create a filter for removing them.

The multi-beam SEM processes the image signal resulting from each beamlet to identify the disturbances and correct them. The inspection tool first transforms the image signal resulting from each beamlet using a linear operator, such as a Hilbert transform. Using the output of the Hilbert transform, the inspection system utilizes standard analytic operations to obtain an instantaneous phase signal, also referred to as a local phase signal, which can be unwrapped and detrended resulting in demodulated representations of the original image signals. The inspection system analyzes the power spectral density (PSD) of each of these demodulated signals that were originally generated by detecting the multiple beamlets. By averaging the PSDs, the image system identifies a filter that can be applied to the original image signals to remove the effects of the dynamic disturbances in the image signals used to produce images of the wafer and integrated circuit.

In addition, the multi-beam SEM system of this example analyzes the PSDs to identify the noise floor for the images. This noise floor is used to remove white noise from the images and to provide further clarity to the scan of the wafer.

Because a Hilbert transformation is used to process the image signal, the inspection tool is able to process the image signals resulting from the multiple beamlets on a line by line basis instead of having to wait for an entire image from each beamlet signal to be available. This can allow for more efficient analysis and, in some embodiments, can be used to correct images in real-time to allow for nearly immediate or real-time adjustments based on the inspection results.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Reference is now made to FIG. 1, which illustrates an exemplary electron beam inspection system consistent with embodiments of the present disclosure. Although the present disclosure refers to an electron beam inspection system (such as a scanning electron microscope (SEM)), it is understood that the present disclosure can apply more generally to charged-particle beam inspection systems and the description of electron beams is exemplary. In some embodiments the charged-particle beam inspection system is a transmission electron microscope or a scanning ion microscope. In some embodiments, the beam inspection system is an electron beam inspection (EBI) system 100. As shown in FIG. 1, electron beam inspection system 1 includes a main chamber 10, a load/lock chamber 20, a charged-particle beam tool 100, and an equipment front end module (EFEM) 30. Electron beam tool 100 is located within main chamber 10.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (a sample can be a wafer or other component, or can be a portion of the wafer or the other component, and the terms sample and wafer can both refer to a same component, can refer to different portions of a same component, or can refer to different components). One or more robot arms (not shown) in EFEM 30 transport the wafers to load/lock chamber 20.

Load/lock chamber 20 is connected to a load/lock vacuum pump system (not shown), which removes gas molecules in load/lock chamber 20 to reach a first pressure below the atmospheric pressure. After reaching the first pressure, one or more robot arms (not shown) transport the wafer from load/lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 100. While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

A controller 50 is electronically connected to electron beam tool 100. Controller 50 may be a computer configured to execute various controls of the electron beam inspection system. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. While the present disclosure provides examples of main chamber 10 housing an electron beam inspection tool 100, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
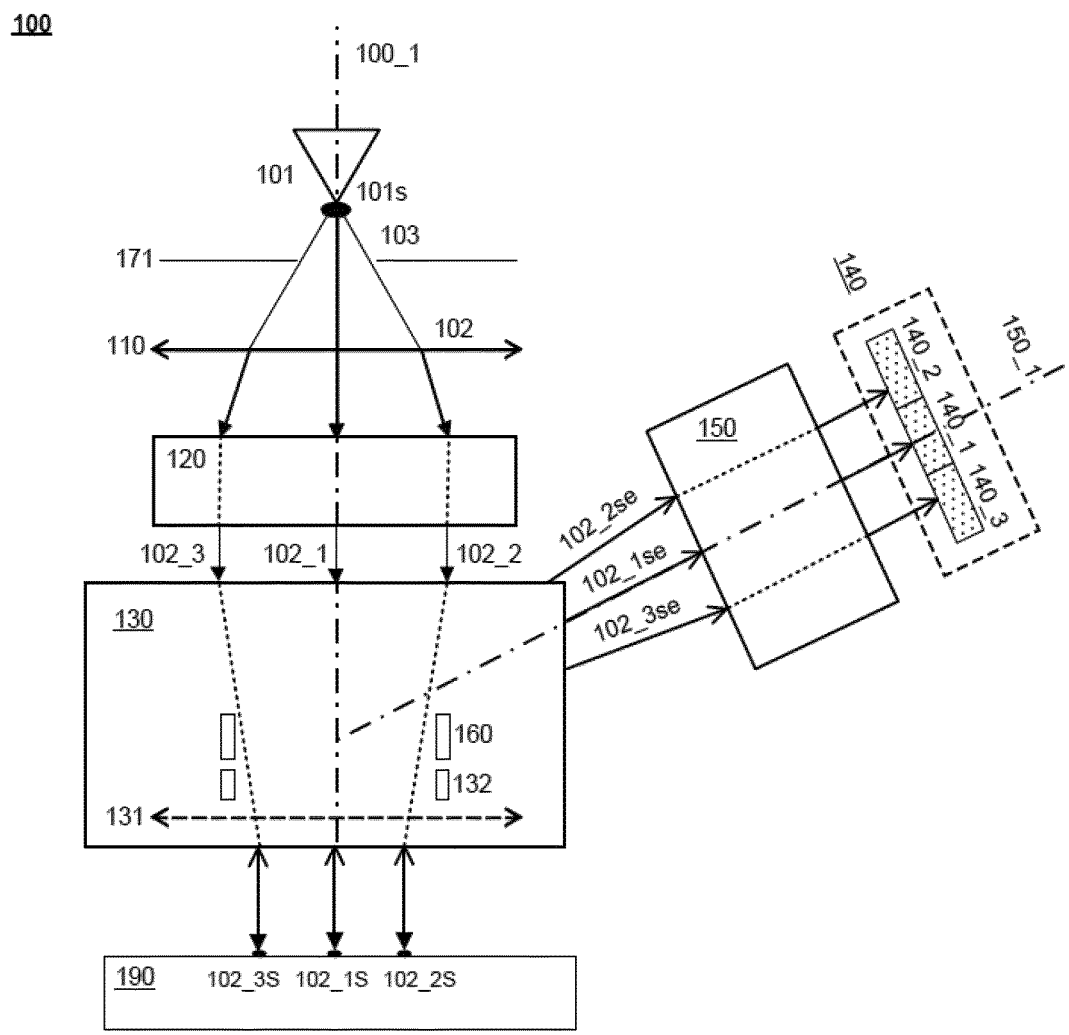
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary multi-beam electron beam tool or, in some embodiments, a multi-beam electron-beam tool, that can be a part of the exemplary electron beam inspection system 1 of FIG. 1, consistent with embodiments of the present disclosure. Electron beam tool 100 (also referred to herein as apparatus 100) comprises an electron beam source 101, a gun aperture plate 171 with a gun aperture 103, a condenser lens 110, a source conversion unit 120, a primary projection optical system 130, a sample stage (not shown in FIG. 2), a secondary optical system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 100 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary optical system 150 and electron detection device 140 can be aligned with a secondary optical axis 150_1 of apparatus 100.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 can comprise an image-forming element array (not shown in FIG. 2). The image-forming element array can comprise a plurality of micro-deflectors or micro-lenses to form a plurality of parallel images (virtual or real) of crossover 101s with a plurality of beamlets of primary electron beam 102. FIG. 2 shows three beamlets 102_1, 102_2, and 102_3 of a multi beam system as an example, and it is appreciated that the source conversion unit 120 can handle any number of beamlets. Controller 50 of FIG. 1 may be connected to various parts of charged-particle beam inspection system 100 of FIG. 1, such as source conversion unit 120, electron detection device 140, primary projection optical system 130, or a motorized stage (not shown). In some embodiments, as explained in further details below, controller 50 may perform various image and signal processing functions. Controller 50 may also generate various control signals to govern operations of the charged-particle beam inspection system.

Condenser lens 110 can focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. Objective lens 131 can focus beamlets 102_1, 102_2, and 102_3 onto a sample 190 for inspection and can form three probe spots 102_1s, 102_2s, and 102_3s on surface of sample 190. Gun aperture plate 171 can block off peripheral electrons of primary electron beam 102 not in use to reduce Coulomb effect. The Coulomb effect can enlarge the size of each of probe spots 102_1s, 102_2s, and 102_3s, and therefore deteriorate inspection resolution.

Beam separator 160 can be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 102_1, 102_2, and 1023 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 190. In response to incidence of beamlets 102_1, 102_2, and 102_3 at probe spots 102_1s, 102_2s, and 102_3s, three secondary electron beams 102_1se, 102_2se, and 102_3se can be emitted from sample 190. Each of secondary electron beams 102_1se, 102_2se, and 102_3se can comprise electron beams with a distribution of energies including secondary electrons (energies ≤50 eV), and backscattered electrons (energies between 50 eV and landing energies of beamlets 102_1, 102_2, and 102_3). Beam separator 160 can direct secondary charged-particle beams 102_1se, 102_2se, and 102_3se towards secondary optical system 150. Secondary optical system 150 can focus secondary electron beams 102_1se, 102_2se, and 102_3se onto detection elements 140_1, 140_2, and 1403 of electron detection device 140. Detection elements 140_1, 140_2, and 140_3 can detect corresponding secondary electron beams 102_1se, 102_2se, and 102_3se and generate corresponding signals, which are sent to controller 50 or a signal processing system (not shown), e.g. to construct images of the corresponding scanned areas of sample 190.

In some embodiments, detection elements 140_1, 1402, and 140_3 detect corresponding secondary electron beams 102_1se, 102_2se, and 102_3se, respectively, and generate corresponding intensity signal outputs (not shown) to an image processing system (e.g., controller 50). In some embodiments, each detection element 140_1, 140_2, and 140_3 may comprise one or more pixels. The intensity signal output of a detection element may be a sum of signals generated by all the pixels within the detection element.

In some embodiments, controller 50 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 140 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 140 and may construct an image. The image acquirer may thus acquire images of sample 190. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 140. An imaging signal may correspond to a scanning operation for conducting charged-particle imaging. An acquired image may be a single image comprising a plurality of imaging areas. The single image may be stored in the storage. The single image may be an original image that may be divided into a plurality of regions. Each of the regions may comprise one imaging area containing a feature of sample 190. The acquired images may comprise multiple images of a single imaging area of sample 190 sampled multiple times over a time sequence. The multiple images may be stored in the storage. In some embodiments, controller 50 may be configured to perform image processing steps with the multiple images of the same location of sample 190.

In some embodiments, controller 50 may include measurement circuitries (e.g., analog-to-digital converters) to obtain a distribution of the detected secondary electrons. The electron distribution data collected during a detection time window, in combination with corresponding scan path data of primary electron beam 102 incident on the wafer surface, can be used to reconstruct images of the wafer structures under inspection. The reconstructed images can be used to reveal various features of the internal or external structures of sample 190, and thereby can be used to reveal any defects that may exist in the wafer.

Reference is now made to FIGS. 3A-3B, which include exemplary images of a sample produced using, for example, electron beam inspection system 100 of FIG. 1, consistent with embodiments of the present disclosure. Image 300 of FIG. 3A represents the unaltered image signal captured by, for example, a SEM. Image 301 of FIG. 3B represents the corrected version of image 300 after processing consistent with embodiments of the present disclosure. Exemplary image 300 of FIG. 3A shows an exemplary image generated by a SEM that includes a sinusoidal dynamic disturbance. For example, image 300 represents an image affected by a stage undergoing mechanical vibrations, such as vibrations from outside of inspection system 100. Image 300 includes imaging of vertically aligned structures, e.g. vertical structure 310, on an exemplary wafer. Although the structures represented by, for example, structure 310 are rectangular, dynamic disturbances can affect the captured image introducing, for example, sinusoidal disturbances in the image. These disturbances can create the wave pattern in the boundaries of the structures shown in image 300. Because of these disturbances, an inspection system, e.g. inspection system 100, may have difficulty accurately distinguishing between defects due to the dynamic disturbances and defects in the manufacturing process.

Image 301 of FIG. 3B, represents the corrected version of image 300. For example, exemplary image 301 represents the result of applying embodiments of the present disclosure (described in more detail below in reference to FIG. 6). As shown in image 301, vertical structures, e.g., represented by virtual structure 311, have a more correct rectangular shape without the sinusoidal dynamic disturbance in the image of structures 310. Following image correction consistent with embodiments of the present disclosure, image 301 can be used to more accurately identify defects in, for example, vertical structure 311 of the wafer without concern regarding whether those defects are the result of image inaccuracy due to dynamic disturbances.

Reference is now made to FIGS. 4A-4B, which include exemplary images of a sample produced using, for example, electron beam inspection system 100 of FIG. 1, consistent with embodiments of the present disclosure. Image 400 of FIG. 4A represents an image from an unaltered image signal captured by, for example, a SEM. Image 401 of FIG. 4B represents the corrected version of image 400 after processing consistent with embodiments of the present disclosure. Exemplary image 400 of FIG. 4A shows an exemplary image generated by a SEM that includes a vibrational noise disturbance. For example, image 400 can represent an image affected by a stage undergoing vibrational noise from vibrations caused by components of the SEM or EBI system 100 itself. Image 400 includes imaging of vertically aligned structures, e.g. vertical structure 410, on an exemplary wafer. Although the structures represented by, for example, structure 410 are rectangular, vibrational noise can affect the captured image introducing, noise along the edges of, for example, structure 410. Because of these disturbances, an inspection system, e.g. inspection system 100, may have difficulty accurately distinguishing between defects due to the dynamic disturbances and defects in the manufacturing process.

Image 401 of FIG. 4B, represents the corrected version of image 400. Exemplary image 401 represents the result of applying embodiments of the present disclosure (described in more detail below in reference to FIG. 6). As shown in image 401, the vertical structures, e.g., represented by vertical structure 411, have a more correct rectangular shape without the vibrational noise disturbance shown in, for example vertical structure 410. Following image correction consistent with embodiments of the present disclosure, image 401 can be used to more accurately identify defects in, for example, vertical structure 411 of the wafer without concern regarding whether those defects are the result of image inaccuracy due to the vibrational disturbances.

Figure 5A:
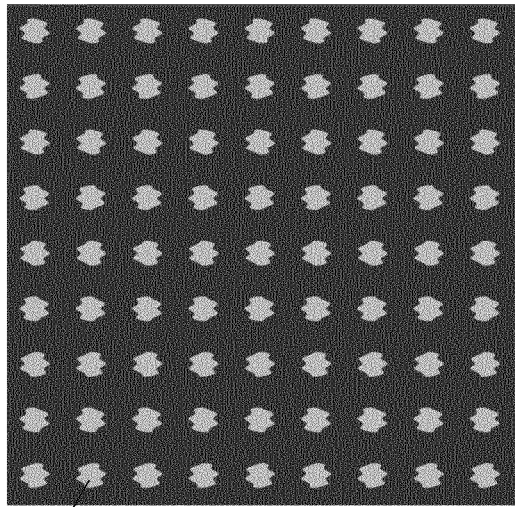
FIGS. 5A-5B are exemplary diagrams of images of a sample scanned by an electron beam inspection system of FIG. 1, consistent with embodiments of the present disclosure.
Figure 5B:
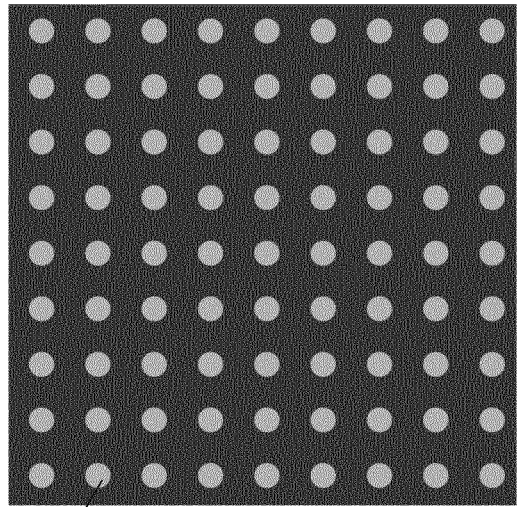

Reference is now made to FIGS. 5A-5B, which include exemplary images of a sample produced using, for example, electron beam inspection system 100 of FIG. 1, consistent with embodiments of the present disclosure. Image 500 of FIG. 5A represents the unaltered image signal captured by, for example, a SEM. Image 501 of FIG. 5B represents the corrected version of image 500 after processing consistent with embodiments of the present disclosure. Exemplary image 500 of FIG. 5A shows an exemplary image generated by a SEM that includes a sinusoidal dynamic disturbance. For example, like image 500 of FIG. 5, image 500 represents an image affected by a stage undergoing sinusoidal dynamic disturbances based on vibrations from outside of the SEM or EBI system 100 itself. Image 500 includes imaging of circular structures, e.g. circular structure 510, on an exemplary wafer. Although the structures represented by, for example, structure 510 are circular, the dynamic disturbance can affect the captured image introducing distortion in, for example, structure 510 of FIG. 5A. Because of these disturbances, an inspection system, e.g. inspection system 100, may have difficulty accurately distinguishing between defects due to the dynamic disturbances and defects in the manufacturing process.

Image 501 of FIG. 5B, represents a more correct version of image 500. Exemplary image 501 represents the result of applying embodiments of the present disclosure (described in more detail below in reference to FIG. 6). As shown in image 501, the circular structures, e.g., represented by circular structure 511, have a more correct circular shape without the sinusoidal dynamic disturbance shown in, for example, circular structure 510. Following image correction consistent with embodiments of the present disclosure, image 501 can be used to more accurately identify defects in, for example, circular structure 511 of the wafer without concern regarding whether those defects are the result of image inaccuracy due to the vibrational disturbances.

One of ordinary skill in the art would understand that the images of FIGS. 3A-3B, 4A-4B, and 5A-5B are exemplary only and that embodiments consistent with the present disclosure are not limited to these specific layouts or types of structures. Embodiments consistent with the present disclosure can process images of any type of structure or layout on a sample.

Figure 6:
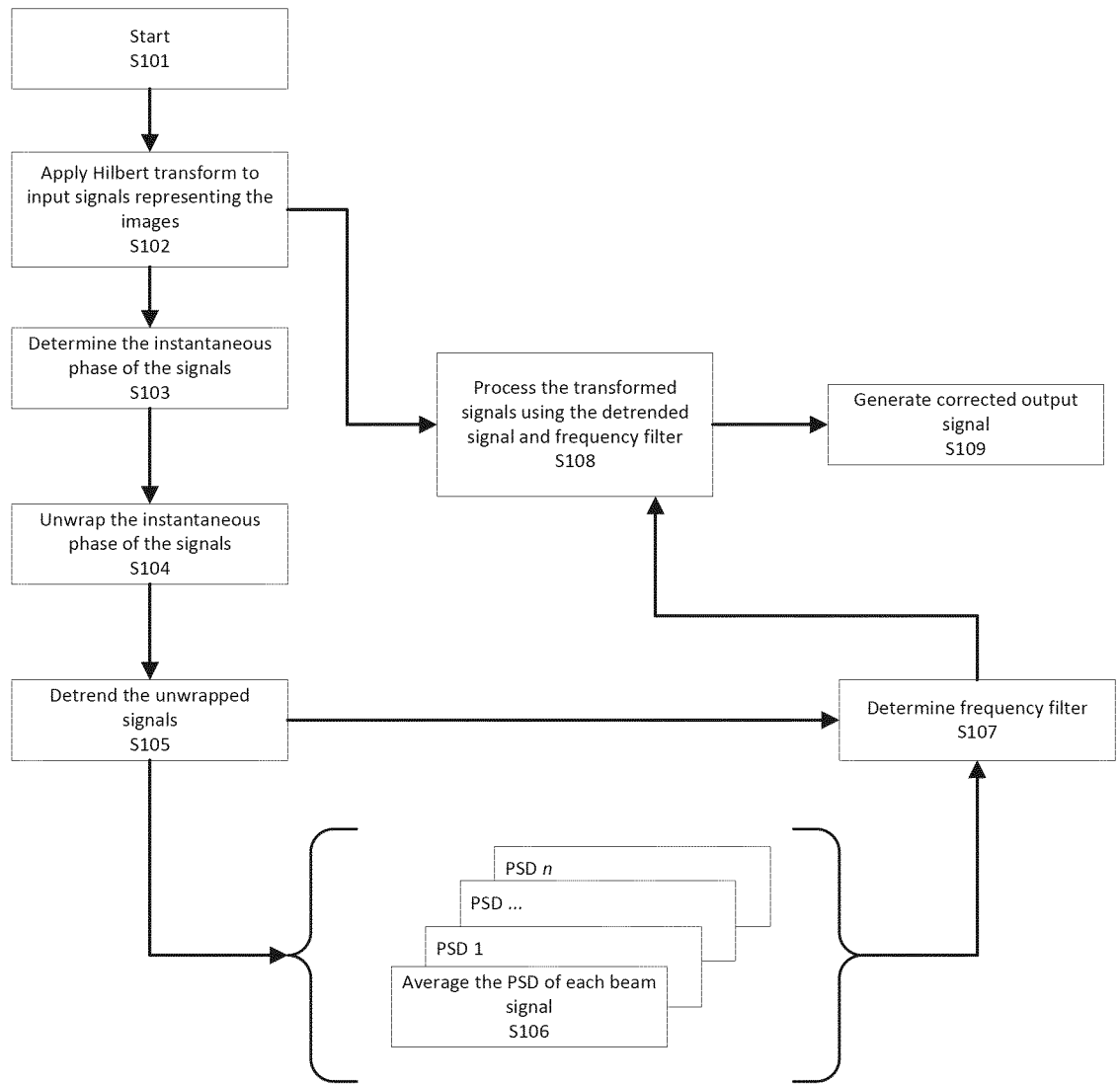
FIG. 6 is a process flow chart of an exemplary method of image enhancement using multiple electron beams, consistent with embodiments of the present disclosure.

Reference is now made to FIG. 6, which illustrates a flowchart of an exemplary method 600 for image enhancement using a multi-beam SEM. A controller (e.g. controller 50 of FIG. 1) may be programmed to implement one or more blocks of the flowchart of FIG. 6. The controller may be coupled with a charged-particle beam apparatus (e.g., EBI tool 100 of FIG. 2). The controller can control operations of the charged-particle beam apparatus including processing images acquired from electron detection device 140.

In the example of FIG. 6, the method starts at step S101. At step S102, the controller applies a Hilbert transform to the image signals resulting from each of the beams (e.g., secondary beamlets 102_1se, 102_2se, and 102_3se of FIG. 2). The Hilbert transform takes the image signals captured by an electron detection device (e.g., electron detection device 140 of FIG. 2) and generates an analytical representation of the signal for further processing. In some embodiments, the Hilbert transform is applied to the entirety of each image signal captured by the electron detection device. In some embodiments, other linear operators, such as a Fourier transform, can be used to process the image signals. In some embodiments using a Hilbert transform, the controller applies the Hilbert transform on a line by line basis to the image signals. In these embodiments, the entire image of the sample or wafer does not need to be generated for the processing and analysis of method 600 to continue. Use of a Hilbert transform reduces the computational complexity of processing the image signals over other linear operators and allows processing to occur on a line-by-line basis. In some embodiments, by operating on a line-by-line basis, the analysis of method 600 can be performed in real time to detect defects and adjust equipment, such as electron beam tool 100 of FIG. 2.

The Hilbert transform described above can be represented by the equation:

$$z_n(t) = x_n(t) + i\mathcal{H}\{x_n(t)\}$$

where $z_n(t)$ is an analytical function of the image signal $x_n(t)$. $\mathcal{H}\{x_n(t)\}$ can be defined as:

$$\mathcal{H}\{x(t)\} = \frac{1}{\pi} PV \int_{-\infty}^{\infty} \frac{x(s)}{t-s} ds.$$

where PV is the Cauchy Principal value of the integral, and n indicates the number of disturbance harmonics under analysis. Using these equations, the image signals can be transformed (e.g., by controller 50 of FIG. 1) into an analytical function.

This analytical function can also be represented as a complex exponential:

$$z_n(t) = \alpha \exp(i\Phi_n(t))$$

where $\alpha$ is the amplitude of the signal and $\Phi$ represents a relevant instantaneous phase of the signal.

At step S103, the output from the Hilbert transform or other linear operator can be further processed (e.g., by controller 50 of FIG. 1) to determine that instantaneous phase of the transformed signals, which provides a time valued analytical function based on the output of the Hilbert transform. The representation of the instantaneous phase of the signals can then be unwrapped (e.g., by controller 50 of FIG. 1) to generate a continuous function representing the signals in step S104. The unwrapped instantaneous phase, $\mathcal{U}$, of the signal can be represented with the equation:

where $\Omega$ represents the carrier frequency of the signal, t is the time variable, $\gamma$ is a phase offset, and $$\mathcal{U}\{\arg(z_n(t))\} = \Phi_n(t) = \Omega t + \gamma + \sum_{i=1}^{n} \beta_i \cos(\omega_i t + \phi_i)$$

$\beta_i$ and $\Phi_i$ are the amplitudes and phases, respectively, of the harmonic phase perturbations of the frequency, $\Omega_i$. Unwrapping the instantaneous phase constrains the image signal to a specific interval of frequencies simplifying further analysis. The unwrapped signal can further be detrended (e.g., by controller 50 of FIG. 1) at step S105 represented by the equation:

which represents isolated harmonic phase modulations of the image signals. Detrending the signal $$\Psi_n(t) = \Phi_n(t) - \Omega t = \gamma + \sum_{i=1}^{N} \beta_i \cos(\omega_i t + \phi_i)$$

removes linear trends from the signal to further isolate distortions introduced by the dynamic disturbances. The isolated phase modulations that result represent the effects of the dynamic disturbances in the signals.

After the image signals are transformed using a Hilbert transform (step S102), the instantaneous phases are determined (S103), the signal is unwrapped (S104) and detrended (S105), the signals can be further analyzed (e.g., by controller 50 of FIG. 1) to find the power spectral density (PSD) of each signal. Because each beam will generally be affected by the dynamic disturbance in a same or similar way, the disturbances introduced in each image signal due to the dynamic disturbance are generally coherent (e.g., the frequencies contained in the disturbance are similar for all beamlets). When the image signals have disturbances that are coherent, this processing can reveal the coherency and isolate the portions of the image signal that were introduced by the dynamic disturbances. After being identified, the distortions in the image signal that were introduced by the dynamic disturbances can be filtered out of the image signals, correcting the resulting images. Additionally, identifying the high frequency portions of the PSDs can provide a noise floor, which can be used to remove white-noise from the image signals providing further clarity in the generated images.

At step S107, the results of averaging the PSDs can be combined with the output of detrending to determine (e.g., by controller 50 of FIG. 1) a frequency filter that can be applied to the image signals. This frequency filter, which is based on the coherence analysis from averaging the PSDs in step S106, can filter out those portions of the image signal that were introduced by the dynamic disturbance or that are white noise.

At step S108, the frequency filter determined in S107 can be applied to the output from the Hilbert transform (e.g., from step s102) to obtain a corrected Hilbert transform of the signals. This corrected Hilbert transform can represent the Hilbert transform function of the image signals adjusted based on the coherence analysis performed from steps S103 through S107. At step S109, the corrected Hilbert transform signal can be used to reconstruct the image of the sample (e.g., by controller 50 of FIG. 1) without the effects of the dynamic disturbances identified by analyzing the coherent disturbances in the individual image signals from each beam (e.g., at steps S103-S107). For example, the initial, disturbed image signal represented by images 300, 400, and 500 of FIGS. 3, 4, and 5 respectively can be corrected into the more accurate images 301, 401, and 501 of FIGS. 3, 4, and 5 respectively using method 600.

The embodiments may further be described using the following clauses:

1. A method related to image enhancement for a multi-beam charged-particle system, the method comprising:
    analyzing signal information representative of first and second images, wherein the first image is associated with a first beam of a set of beams and the second image is associated with a second beam of the set of beams;
    detecting, based on the analysis, disturbances in positioning of the first and second beams in relation to a sample;
    obtaining an image of the sample using the signal information of the first and second beams; and
    correcting the image of the sample based on the detected disturbances.
2. The method of clause 1, wherein analyzing the signal information further comprises using coherent filtering to analyze the signal information.
3. The method of clause 2, wherein using coherent filtering further comprises:
    applying a linear operator to the signal information;
    generating a filter based on properties of the first and second images; and
    filtering the signal information by applying the filter to the signal information.
4. The method of clause 3 wherein the filter is based on averaging power spectral densities of the first and second images.
5. The method of any one of clauses 3 and 4 wherein the filter is based on determining a peak in the cross-spectral density for a combination of the first and second images.
6. The method of clause 5 wherein the peak includes a plurality of peaks in the cross-spectral density for a combination of the first and second images.
7. The method of any one of clauses 3 to 6, wherein the linear operator includes a Hilbert transform.
8. The method of any one of clauses 3 to 7, wherein the linear operator includes a Fourier transform.
9. The method of any one of clauses 3 to 8, wherein generating the filter further comprises analyzing signal information representing an entirety of each of the first and second images.
10. The method of any one of clauses 3 to 7, wherein generating the filter further comprises analyzing signal information representing a scan line of the first and second images.
11. The method of any one of clauses 1 to 10, further comprising:
    filtering white noise in the signal information with a white noise filter.
12. The method of clause 11, wherein the white noise filter is based on a power spectral density of at least one of the first and second images.
13. The method of any one of clauses 1 to 12, wherein the charged-particle system is one of a scanning electron microscope, a transmission electron microscope, or a scanning ion microscope.
14. The method of any one of clauses 1 to 13, wherein the first and second beams are beamlets and the set of beams is a set of beamlets.
15. A system for multi-beam scanning, comprising:
    a detector including circuitry for detecting signal information representative of first and second images, wherein the first image is associated with a first beam of a set of beams and the second image is associated with a second beam of the set of beams;

a controller with at least one processor and a non-transitory computer readable medium comprising instructions that, when executed by the processor, cause the controller to:

analyze the signal information;

detect, based on the analysis, disturbances in positioning of the first and second beams in relation to a sample;

obtain an image of the sample using the signal information of the first and second beams; and correct the image of the sample using the identified disturbances.

16. The system of clause 15, wherein the instructions, when executed by the processor, further causes the controller to analyze the signal information using coherent filtering to analyze the signal information.

17. The system of clause 15, wherein the instructions, when executed by the processor to analyze the signal information using coherent filtering, further causes the controller to:

apply a linear operator to the signal information;

generate a filter based on the properties of the first and second images; and filter the signal information by applying the filter to the signal information.

18. The system of clause 17 wherein the filter is based on an average of power spectral densities of the first and second images.

19. The system of any one of clauses 17 and 18, wherein the filter is based on a determination of at least one peak in the cross-spectral density for a combination of the first and second images.

20. The system of clause 19, wherein the peak includes a plurality of peaks in the cross-spectral density for a combination of the first and second images.

21. The system of any one of clauses 17 to 20, wherein the linear operator includes a Hilbert transform.

22. The system of any one of clauses 17 to 20, wherein the linear operator includes a Fourier transform.

23. The system of any one of clauses 17 to 21, wherein the instructions, when executed by the processor to generate the filter, further cause the controller to analyze signal information representing an entirety of each image of the first and second images.

24. The system of any one of clauses 17 to 21, wherein the instructions, when executed by the processor to generate the filter, further cause the controller to analyze signal information representing a scan line of the first and second images.

25. The system of any one of clauses 15 to 24, wherein the instructions, when executed by the processor, further cause the controller to filter white noise in the signal information with a white noise filter.

26. The system of clause 25, wherein the white noise filter is based on a power spectral density of at least one of the first and second images.

27. The system of any one of clauses 15 to 25, wherein the first and second beams are beamlets and the set of beams is a set of beamlets.

28. A non-transitory computer readable medium storing a set of instructions that is executable by one or more processors of a system to cause the system to perform a method comprising:

analyzing signal information representative of first and second images, wherein the first image is associated with a first beam of a set of beams and the second image is associated with a second beam of the set of beams;

detecting, based on the analysis, disturbances in positioning of the first and second beams in relation to a sample;

obtaining an image of the sample using the signal information of the first and second beams; and correcting the image of the sample using the identified disturbances.

29. The non-transitory computer readable medium of clause 28, wherein the set of instructions that is executable by the one or more processors of the system further cause the system to perform analyzing the signal information using coherent filtering to analyze the signal information.

30. The non-transitory computer readable medium of clause 29, wherein the set of instructions that is executable by the one or more processors of the system further cause the system to perform:

applying a linear operator to the signal information;

generating a filter based on the properties of the first and second images; and filtering the signal information by applying the filter to the signal information.

31. The non-transitory computer readable medium of clause 30, is based on averaging power spectral densities of the first and second images.

32. The non-transitory computer readable medium of any one of clauses 30 and 31 wherein the filter is based on determining at least one peak in the cross-spectral density for a combination of the first and second images.

33. The non-transitory computer readable medium of clause 32, wherein the peak includes a plurality of peaks in the cross-spectral density for a combination of the first and second images.

34. The non-transitory computer readable medium of any one of clauses 30 to 33, wherein the linear operator includes a Hilbert transform.

35. The non-transitory computer readable medium of any one of clauses 30 to 34, wherein the linear operator includes a Fourier transform.

36. The non-transitory computer readable medium of any one of clauses 30 to 35, wherein the set of instructions that is executable by the one or more processors of the system further cause the system to perform:

analyzing signal information representing an entirety of each of the first and second images.

37. The non-transitory computer readable medium of any one of clauses 30 to 34, wherein the set of instructions that is executable by the one or more processors of the system further cause the system to perform:

analyzing signal information representing a scan line of the first and second images.

38. The non-transitory computer readable medium of any one of clauses 28 to 37, wherein the set of instructions that is executable by the one or more processors of the system further cause the system to perform:

filtering white noise in the signal information with a white noise filter.

39. The non-transitory computer readable medium of clause 38, wherein the white noise filter is based on a power spectral density of at least one of the first and second images.

The non-transitory computer readable medium of clause 39, wherein the first and second beams are beamlets and the set of beams is a set of beamlets.

40. A method related to image enhancement for a multi-beam charged-particle system, the method comprising:
    performing a frequency analysis of signal information representative of first and second images, wherein the first image is associated with a first beam of a set of beams and the second image is associated with a second beam of the set of beams;
    detecting, based on the analysis, disturbances in positioning of the first and second beams in relation to a sample;
    obtaining an image of the sample using the signal information of the first and second beams; and
    correcting the image of the sample based on the detected disturbances.

41. A system for multi-beam scanning, comprising:
    a detector including circuitry for detecting signal information representative of first and second images, wherein the first image is associated with a first beam of a set of beams and the second image is associated with a second beam of the set of beams;
    a controller with at least one processor and a non-transitory computer readable medium comprising instructions that, when executed by the processor, cause the controller to:
        perform a frequency analysis of the signal information;
        detect, based on the analysis, disturbances in positioning of the first and second beams in relation to a sample;
        obtain an image of the sample using the signal information of the first and second beams; and
        correct the image of the sample using the identified disturbances.

42. A method related to image enhancement for a multi-beam charged-particle system, the method comprising:
    performing a frequency analysis of signal information representative of first and second images, wherein the first image is associated with a first beam of a set of beams and the second image is associated with a second beam of the set of beams;
    detecting, based on the frequency analysis, disturbances in positioning of the first and second beams in relation to a sample;
    obtaining an image of the sample using the signal information of the first and second beams; and
    correcting the image of the sample based on the detected disturbances.

43. The method of clause 42, wherein analysis of the signal information further comprises using coherent filtering to analyze the signal information.

44. The method of clause 43, wherein using coherent filtering further comprises:
    applying a linear operator to the signal information;
    generating a filter based on properties of the first and second images; and
    filtering the signal information by applying the filter to the signal information.

45. The method of clause 44, wherein the filter is based on averaging power spectral densities of the first and second images.

46. The method of clause 44, wherein the filter is based on determining a peak in the cross-spectral density for a combination of the first and second images.

47. The method of clause 46, wherein the peak includes a plurality of peaks in the cross-spectral density for a combination of the first and second images.

48. The method of clause 44, wherein the linear operator includes a Hilbert transform.

49. The method of clause 44, wherein the linear operator includes a Fourier transform.

50. The method of clause 44, wherein generating the filter further comprises analyzing signal information representing an entirety of each of the first and second images.

51. The method of clause 44, wherein generating the filter further comprises analyzing signal information representing a scan line of the first and second images.

52. The method of clause 42, wherein performing the frequency analysis further comprises:
    determining a power spectral density based on the signal information; and
    wherein correcting the image of the sample further comprises:
    based on the power spectral density, filtering out a portion of the signal information that indicates dynamic disturbance or that indicates white noise.

53. The method of clause 42, further comprising:
    filtering white noise in the signal information with a white noise filter.

54. The method of clause 53, wherein the white noise filter is based on a power spectral density of at least one of the first and second images.

55. The method of clause 42, wherein the charged-particle system is one of a scanning electron microscope, a transmission electron microscope, or a scanning ion microscope.

56. A system for multi-beam scanning, comprising:
    a detector including circuitry for detecting signal information representative of first and second images, wherein the first image is associated with a first beam of a set of beams and the second image is associated with a second beam of the set of beams;
    a controller with at least one processor and a non-transitory computer readable medium comprising instructions that, when executed by the processor, cause the controller to:
        perform a frequency analysis of the signal information;
        detect, based on the frequency analysis, disturbances in positioning of the first and second beams in relation to a sample;
        obtain an image of the sample using the signal information of the first and second beams; and
        correct the image of the sample using the identified disturbances.

A non-transitory computer readable medium may be provided that stores instructions for a processor that can be part of, for example EBI tool 100 of FIG. 2, to carry out thermal sensing, flow sensing, image inspection, image acquisition, stage positioning, beam focusing, electric field adjustment, cleaning, hardening, heat treatment, material removal, and polishing, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), cloud storage, a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A method related to image enhancement for a multi-beam charged-particle system, the method comprising:
performing a frequency analysis of signal information representative of first and second images, wherein the first image is associated with a first beam of a set of beams and the second image is associated with a second beam of the set of beams;
detecting, based on the frequency analysis, disturbances in positioning of the first and second beams in relation to a sample;
obtaining an image of the sample using the signal information of the first and second beams; and
correcting the image of the sample based on the detected disturbances.

2. The method of claim 1, wherein analysis of the signal information further comprises using coherent filtering to analyze the signal information.

3. The method of claim 2, wherein using coherent filtering further comprises:
applying a linear operator to the signal information;
generating a filter based on properties of the first and second images; and
filtering the signal information by applying the filter to the signal information.

4. The method of claim 3, wherein the filter is based on averaging power spectral densities of the first and second images.

5. The method of claim 3, wherein the filter is based on determining a peak in the cross-spectral density for a combination of the first and second images.

6. The method of claim 5, wherein the peak includes a plurality of peaks in the cross-spectral density for a combination of the first and second images.

7. The method of claim 3, wherein the linear operator includes a Hilbert transform.

8. The method of claim 3, wherein the linear operator includes a Fourier transform.

9. The method of claim 3, wherein generating the filter further comprises analyzing signal information representing an entirety of each of the first and second images.

10. The method of claim 3, wherein generating the filter further comprises analyzing signal information representing a scan line of the first and second images.

11. The method of claim 1, wherein performing the frequency analysis further comprises:
determining a power spectral density based on the signal information; and
wherein correcting the image of the sample further comprises:
based on the power spectral density, filtering out a portion of the signal information that indicates dynamic disturbance or that indicates white noise.

12. The method of claim 1, further comprising:
filtering white noise in the signal information with a white noise filter.

13. The method of claim 12, wherein the white noise filter is based on a power spectral density of at least one of the first and second images.

14. The method of claim 1, wherein the charged-particle system is one of a scanning electron microscope, a transmission electron microscope, or a scanning ion microscope.

15. A system for multi-beam scanning, comprising:
a detector including circuitry for detecting signal information representative of first and second images, wherein the first image is associated with a first beam of a set of beams and the second image is associated with a second beam of the set of beams;
a controller with at least one processor and a non-transitory computer readable medium comprising instructions that, when executed by the processor, cause the controller to:
perform a frequency analysis of the signal information;
detect, based on the frequency analysis, disturbances in positioning of the first and second beams in relation to a sample;
obtain an image of the sample using the signal information of the first and second beams; and
correct the image of the sample using the identified disturbances.

* * * * *